(12) United States Patent
Kim et al.

(10) Patent No.: US 10,483,327 B2
(45) Date of Patent: Nov. 19, 2019

(54) LIGHT EMITTING DIODE AND DISPLAY DEVICE INCLUDING THE SAME

(71) Applicant: SAMSUNG DISPLAY CO., LTD., Yongin-si, Gyeonggi-do (KR)

(72) Inventors: Dong Chan Kim, Yongin-si (KR); Won Jong Kim, Yongin-si (KR); Ji Young Moon, Yongin-si (KR); Dong Kyu Seo, Yongin-si (KR); Myung Chul Yeo, Yongin-si (KR); Ji Hye Lee, Yongin-si (KR); Yoon Hyeung Cho, Yongin-si (KR)

(73) Assignee: Samsung Display Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/858,252

(22) Filed: Dec. 29, 2017

(65) Prior Publication Data

US 2018/0269265 A1 Sep. 20, 2018

(30) Foreign Application Priority Data

Mar. 14, 2017 (KR) .................. 10-2017-0031944

(51) Int. Cl.
*H01L 27/32* (2006.01)
*H01L 51/52* (2006.01)

(52) U.S. Cl.
CPC ...... *H01L 27/3209* (2013.01); *H01L 51/5203* (2013.01); *H01L 51/5278* (2013.01)

(58) Field of Classification Search
CPC combination set(s) only.
See application file for complete search history.

(56) References Cited

U.S. PATENT DOCUMENTS 6,893,744 B2  5/2005  Kim et al.
7,868,538 B2  1/2011  Lee et al.
(Continued)

FOREIGN PATENT DOCUMENTS

KR  10-0474891 B1  2/2005
KR  10-0672535 B1  1/2007
(Continued)

OTHER PUBLICATIONS

Yongbiao Zhao et al. Highly Stable and high power efficiency tandem organic light-emitting diodes with transition metal oxide-based charge generation layers, Organic Electronics, 23 (2015) 70-75.
(Continued)

*Primary Examiner* — Mamadou L Diallo
(74) *Attorney, Agent, or Firm* — Lee & Morse, P.C.

(57) ABSTRACT

A light-emitting diode includes a first electrode, a second electrode overlapping the first electrode, a first emission layer and a second emission layer provided between the first electrode and the second electrode, and a first charge generating layer provided between the first emission layer and the second emission layer, the first charge generating layer including a p-type charge generating layer and an n-type charge generating layer. The n-type charge generating layer may include an organic material and an inorganic material doped to the organic material, and the inorganic material may include a lanthanide metal or an alkali earth metal, and an alkali halide.

18 Claims, 3 Drawing Sheets

(56) References Cited

U.S. PATENT DOCUMENTS

| | | | |
|---|---|---|---|
| 7,931,975 | B2 | 4/2011 | Begley et al. |
| 8,563,144 | B2 | 10/2013 | Kim et al. |
| 2007/0085086 | A1 | 4/2007 | Gohara et al. |
| 2016/0056400 | A1 | 2/2016 | Kim et al. |
| 2016/0056403 | A1 | 2/2016 | Kim et al. |
| 2016/0155976 | A1* | 6/2016 | Kim .................. H01L 51/5044 257/40 |
| 2017/0133616 | A1* | 5/2017 | Kim .................... H01L 51/504 |
| 2017/0222162 | A1 | 8/2017 | Lee et al. |
| 2018/0006260 | A1* | 1/2018 | Yoon .................. H01L 51/5056 |
| 2018/0118742 | A1* | 5/2018 | Joo ...................... C07D 471/04 |
| 2018/0166647 | A1* | 6/2018 | Shin .................... H01L 51/0072 |

FOREIGN PATENT DOCUMENTS

| | | |
|---|---|---|
| KR | 10-0796604 B1 | 1/2008 |
| KR | 10-1427453 B1 | 7/2014 |
| KR | 10-2015-0078669 A | 7/2015 |
| KR | 10-2016-0024349 A | 3/2016 |
| KR | 10-2017-0000053 A | 1/2017 |

OTHER PUBLICATIONS

Yu-Hao Lee et al., The metal interlayer in the charge generation layer of tandem organic light-emitting Diodes, AIP Journal of Applied Physics, 114, 154512 (2013).

Yan-Hong Deng, et al. The role of charge generation layers in the operational stability of tandem organic light-emitting diodes, J. Mater Chem. 2014, 2. 1982-2989, 2014.

Jin-Peng Yang et al. Electric-Field-Assisted Charge Generation and Separation Process in Transition Metal Oxide-Based interconnectors for tandem organic light-emitting diodes, Adv. Function Mater, 2011, xx, 1-9.

Yonghua Chen et al. Organic semiconductor heterojunction as charge generation layer in tandem organic light-emitting diodes for high power efficiency, Organic Electronics, 13 (2012) 1121-1128.

Provisional double patenting rejection over claims of the above-identified application; USPTO Office action dated Nov. 1, 2018, in U.S. Appl. No. 15/677,137.

* cited by examiner

LIGHT EMITTING DIODE AND DISPLAY DEVICE INCLUDING THE SAME

CROSS-REFERENCE TO RELATED APPLICATION

Korean Patent Application No. 10-2017-0031944 filed on Mar. 14, 2017, in the Korean Intellectual Property Office, and entitled: "Light Emitting Diode and Display Device Including the Same," is incorporated by reference herein in its entirety.

BACKGROUND

1. Field

Embodiments relate to a light-emitting diode and a display device including the same.

2. Description of the Related Art

An organic light emitting diode display device is a self-emissive display diode with merits of a wide viewing angle, outstanding contrast, and a fast response time.

The organic light emitting diode display device includes an organic light emitting element for emitting light, and the organic light emitting element generates excitons by combining electrons injected by one electrode and holes injected by another electrode on an emission layer, and emits light when the excitons output energy.

The above information disclosed in this Background section is only for enhancement of understanding of the background of the invention and therefore it may contain information that does not form the prior art that is already known in this country to a person of ordinary skill in the art.

SUMMARY

Embodiments are directed to a light-emitting diode, including a first electrode, a second electrode overlapping the first electrode, a first emission layer and a second emission layer provided between the first electrode and the second electrode, and a first charge generating layer provided between the first emission layer and the second emission layer, the first charge generating layer including a p-type charge generating layer and an n-type charge generating layer. The n-type charge generating layer may include an organic material and an inorganic material doped to the organic material, and the inorganic material may include a lanthanide metal or an alkali earth metal, and an alkali halide.

The p-type charge generating layer may include a transition metal halide.

The p-type charge generating layer may include at least one selected from among $CuI$, $AgI$, $AuI$, $ZnI_2$, $NiI_2$, $PdI_2$, $PtI_2$, $CoI_2$, $RhI_2$, $IrI_2$, $FeI_2$, $RuI_2$, $IrI_2$, $FeI_2$, $RuI_2$, $OsI_2$, $MnI_2$, $TcI_2$, $ReI_2$, $CrI_3$, $MoI_3$, $WI_3$, $VI_3$, $NbI_3$, $TaI_3$, $TiI_4$, $ZrI_4$, $HfI_4$, $SnI_2$, $SnI_4$, $GeI_2$, $GeI_4$, $CuBr$, $AgBr$, $AuBr$, $ZnBr_2$, $NiBr_2$, $PdBr_2$, $PtBr_2$, $CoBr_2$, $RhBr_2$, $IrBr_2$, $FeBr_2$, $RuBr_2$, $IrBr_2$, $FeBr_2$, $RuBr_2$, $OsBr_2$, $MnBr_2$, $TcBr_2$, $ReBr_2$, $CrBr_3$, $MoBr_3$, $WBr_3$, $VBr_3$, $NbBr_3$, $TaBr_3$, $TiBr_4$, $ZrBr_4$, $HfBr_4$, $CuCl$, $AgCl$, $AuCl$, $ZnCl_2$, $NiCl_2$, $PdCl_2$, $PtCl_2$, $CoCl_2$, $RhCl_2$, $IrCl_2$, $FeCl_2$, $RuCl_2$, $IrCl_2$, $FeCl_2$, $RuCl_2$, $OsCl_2$, $MnCl_2$, $TcCl_2$, $ReCl_2$, $CrCl_3$, $MoCl_3$, $WCl_3$, $VCl_3$, $NbCl_3$, $TaCl_3$, $TiCl_4$, $ZrCl_4$, and $HfCl_4$.

The p-type charge generating layer may not include an organic material.

The p-type charge generating layer may include a transition metal halide doped to an organic material.

A content of an inorganic material doped on the n-type charge generating layer may be about 1 volume % to about 25 volume %.

A volume ratio of the lanthanide metal or the alkali earth metal from among the inorganic material vs. the alkali halide may be about 1:1.

The inorganic material may include the lanthanide metal, the alkali halide, and a ternary compound generated by combining the lanthanide metal and the alkali halide, or the inorganic material may include the alkali earth metal, the alkali halide, and a ternary compound generated by combining the alkali earth metal and the alkali halide.

The inorganic material may includes at least one metal selected from among La, Ce, Pr, Nd, Pm, Sm, Eu, Gd, Tb, Dy, Ho, Er, Tm, Yb, Lu, Mg, Ca, Sr, Ba, and Ra, at least one alkali halide selected from among LiCl, NaCl, KCl, RbCl, CsCl, FrCl, LiBr, NaBr, KBr, RbBr, CsBr, FrBr, LiI, NaI, KI, RbI, CsI, and FrI, and a ternary compound generated by combining one selected from among the metals and one selected from among the alkali halides.

The inorganic material may include at least one selected from Yb, Eu, Sm, Tm, Mg, Ca, Sr, KI, RbI, CsI, $YbKI_3$, $YbRbI_3$, and $YbCsI_3$.

The light-emitting diode may further includes a third emission layer provided between the first electrode and the second electrode, and a second charge generating layer provided between the second emission layer and the third emission layer, the second charge generating layer including a second p-type charge generating layer and a second n-type charge generating layer. The second n-type charge generating layer may include an organic material and an inorganic material doped to the organic material, and the inorganic material may include an alkali halide doped to the lanthanide metal or the alkali earth metal.

The second p-type charge generating layer may include a transition metal halide.

Embodiments are also directed to a display device, including a substrate, a transistor provided on the substrate, and a light-emitting diode connected to the transistor, the light-emitting diode including a first electrode, a second electrode overlapping the first electrode, a first emission layer and a second emission layer provided between the first electrode and the second electrode, and a first charge generating layer provided between the first emission layer and the second emission layer, the first charge generating layer including a p-type charge generating layer and an n-type charge generating layer. The n-type charge generating layer may include an organic material and an inorganic material doped to the organic material, and the inorganic material may include an alkali halide doped to the lanthanide metal or the alkali earth metal.

The p-type charge generating layer may include a transition metal halide.

The p-type charge generating layer may not include an organic material.

The p-type charge generating layer may include a transition metal halide doped to the organic material.

A content of an inorganic material doped from among the n-type charge generating layer may be about 1 volume % to about 25 volume %.

A volume ratio of the lanthanide metal or the alkali earth metal from among the inorganic material vs. the alkali halide may be about 1:1.

The inorganic material may include the lanthanide metal, the alkali halide, and a ternary compound generated by combining the lanthanide metal and the alkali halide, or the inorganic material may include the alkali earth metal, the alkali halide, and a ternary compound generated by combining the alkali earth metal and the alkali halide.

The display device may further include a third emission layer provided between the first electrode and the second electrode, and a second charge generating layer provided between the second emission layer and the third emission layer, the second charge generating layer including a second p-type charge generating layer and a second n-type charge generating layer. The second n-type charge generating layer may include an organic material and an inorganic material doped to the organic material, and the inorganic material may include an alkali halide doped to the lanthanide metal or the alkali earth metal.

BRIEF DESCRIPTION OF THE DRAWINGS

Features will become apparent to those of skill in the art by describing in detail example embodiments with reference to the attached drawings in which.

DETAILED DESCRIPTION

Figure 1:
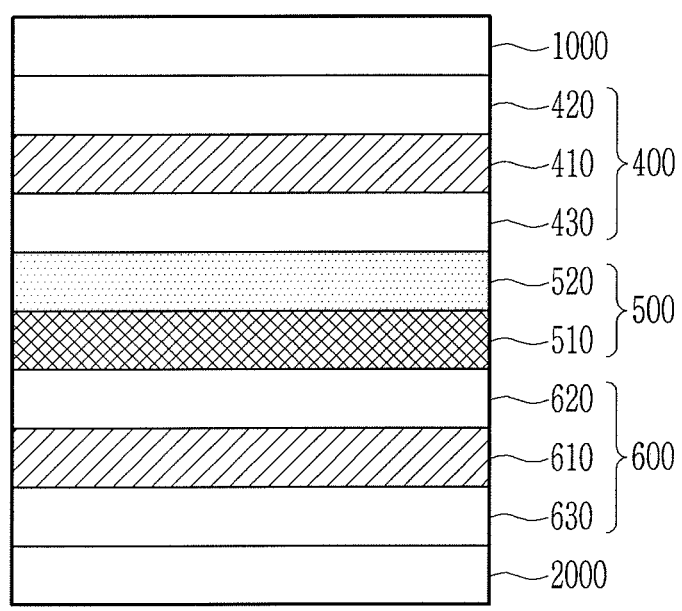
FIG. 1 illustrates a cross-sectional view of a light-emitting diode according to an example embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout.

The size and thickness of each configuration shown in the drawings are arbitrarily shown for better understanding and ease of description, and embodiments are not limited thereto.

It will be understood that when an element such as a layer, film, region, or substrate is referred to as being "on" another element, it can be directly on the other element or intervening elements may also be present. In contrast, when an element is referred to as being "directly on" another element, there are no intervening elements present. The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

The phrase "on a plane" means viewing the object portion from the top, and the phrase "on a cross-section" means viewing a cross-section of which the object portion is vertically cut from the side.

FIG. 1 shows a cross-sectional view of a light-emitting diode according to an example embodiment.

Referring to FIG. 1, in the present example embodiment the light-emitting diode includes a first electrode 1000, a second electrode 2000 overlapping the first electrode 1000, a first charge generating layer 500 provided between the first electrode 1000 and the second electrode 2000, a first light-emission unit 400 provided between the first charge generating layer 500 and the first electrode 1000, and a second light-emission unit 600 provided between the first charge generating layer 500 and the second electrode 2000.

The first light-emission unit 400 includes a first electron transfer layer 420 and a first hole transfer layer 430 overlapping with a first emission layer 410 provided therebetween, and the second light-emission unit 600 includes a second electron transfer layer 620 and a second hole transfer layer 630 with a second emission layer 610 provided therebetween.

The first charge generating layer 500 includes an n-type charge generating layer 510 and a p-type charge generating layer 520, and the n-type charge generating layer 510 is provided closer to the second electrode 2000 than the p-type charge generating layer 520. The n-type charge generating layer 510 is provided near the second electron transfer layer 620 of the second light-emission unit 600, and the p-type charge generating layer 520 is provided near the first hole transfer layer 430 of the first light-emission unit 400.

The first charge generating layer 500 may control a balance of charges between the first light-emission unit 400 and the second light-emission unit 600, and the p-type charge generating layer 520 and the n-type charge generating layer 510 included in the first charge generating layer 500 may generate holes and electrons and inject the same into the first light-emission unit 400 and the second light-emission unit 600.

In the present example embodiment, the n-type charge generating layer 510 includes an organic material and an inorganic material doped to the organic material, and the inorganic material includes an alkali halide doped to a lanthanide metal or an alkali earth metal.

The lanthanide metal may be, for example, one selected from among La, Ce, Pr, Nd, Pm, Sm, Eu, Gd, Tb, Dy, Ho, Er, Tm, Yb, and Lu.

The alkali earth metal may be, for example, one selected from among Mg, Ca, Sr, Ba, and Ra.

The alkali halide may be, for example, one selected from among LiCl, NaCl, KCl, RbCl, CsCl, FrCl, LiBr, NaBr, KBr, RbBr, CsBr, FrBr, LiI, NaI, KI, RbI, CsI, and FrI.

The lanthanide metal and the alkali earth metal may be low work function metals with a low work function, and they may provide electrons. The low work function metal may be, for example, a metal with a work function that is less than about 3.7 eV. Metals such as Yb (2.6 eV), Eu (2.5 eV), Sm (2.7 eV), Mg (3.66 eV), Ca (2.87 eV), Sr (2.59 eV), or Ba (2.52 eV) have low work functions and may provide excellent reactivity. Including one or more of these material may help enhance the performance of providing electrons.

In the present example embodiment, the n-type charge generating layer 510 may include an organic material, a low work function metal with high reactivity such as a lanthanide metal or an alkali earth metal, and an alkali halide.

The n-type charge generating layer 510 may serve as a layer for generating electrons. Doping the alkali earth metal or the lanthanide metal may help for donation of electrons, but such a compound may be unstable in a single state, such that it may be difficult to handle and store the same. When doped to an organic material, the provision of electrons may be limited. According to the present example embodiment, the n-type charge generating layer 510 may have the low work function metal (for example, lanthanide metal or alkali earth metal) and the alkali halide simultaneously deposited to the organic material, which may induce a spontaneous reaction in the organic material and increase a generated amount of charges.

In an example embodiment, a content of the inorganic material doped to the n-type charge generating layer 510 may be about 1 volume % to about 25 volume %.

A content of the doped inorganic material that is about 1 volume % or more may help ensure a sufficient electron providing characteristic. A content of the doped inorganic material that is about 25 volume % or less may help ensure that the inorganic material stably exists in the n-type charge generating layer 510.

In the present example embodiment, a volume ratio of the inorganic material such as the lanthanide metal or the alkali earth metal vs. the alkali halide may be about 1:1. For example, when the lanthanide metal is Yb and the alkali halide is KI, the volume ratio of Yb:KI may be 1:1 in the n-type charge generating layer 510.

In the present example embodiment, the volume ratio may be measured with reference to the volume of a target in a thermal deposition process for doping. That is, when Yb and KI are doped to the organic material, a reduced amount of the target of Yb used for the thermal deposition and a reduced amount of the target of KI may be measured to output a volume ratio.

In an example embodiment, the inorganic material in the n-type charge generating layer 510 may include a lanthanide metal, an alkali halide, and a ternary compound of the combined lanthanide metal and alkali halide. In an example embodiment, the inorganic material may include an alkali earth metal, an alkali halide, and a ternary compound of the combined alkali earth metal and alkali halide. For example, when the lanthanide metal is Yb and the alkali halide is KI, the n-type charge generating layer 510 may include three compounds of Yb, KI, and YbKI. When it includes such various forms of compounds, it may provide better performance of providing electrons. As another example, when I included in KI reacts to Yb to form YbKI, free electrons may be formed by halogen vacancy and conductivity may be improved. Further, conductivity may be improved by remaining metal ions after the reaction.

The n-type charge generating layer may include at least one low work function metal selected from among La, Ce, Pr, Nd, Pm, Sm, Eu, Gd, Tb, Dy, Ho, Er, Tm, Yb, Lu, Mg, Ca, Sr, Ba, and Ra, at least one alkali halide selected from among LiCl, NaCl, KCl, RbCl, CsCl, FrCl, LiBr, NaBr, KBr, RbBr, CsBr, FrBr, LiI, NaI, KI, RbI, CsI, and FrI, and a ternary compound that is a combination of one selected from among the low work function metals and one selected from among the alkali halides.

In the present example embodiment, the organic material of the n-type charge generating layer may include an organic material suitable for an electron transfer layer. For example, it may include a quinoline derivative, and, for example, it may include at least one compound selected from among tris(8-hydroxyquinolinato)aluminum (Alq3), 3-(4 biphenyl)-4-phenyl-5-(4-tert-butylphenyl)-1,2,4-triazole (TAZ), (2-methyl-8-quninolinato)-4-phenylphenolate (Balq), bis(10-hydroxybenzo(h)quinolinato)beryllium (Bebq2), and 4,7-diphenyl-1-10-phenanthroline (BPhen).

The p-type charge generating layer 520 will now be described.

In the present example embodiment, the p-type charge generating layer 520 may include a transition metal halide. For example, the p-type charge generating layer 520 may include at least one selected from among CuI, AgI, AuI, $ZnI_2$, $NiI_2$, $PdI_2$, $PtI_2$, $CoI_2$, $RhI_2$, $IrI_2$, $FeI_2$, $RuI_2$, $IrI_2$, $FeI_2$, $RuI_2$, $OsI_2$, $MnI_2$, $TcI_2$, $ReI_2$, $CrI_3$, $MoI_3$, $WI_3$, $VI_3$, $NbI_3$, $TaI_3$, $TiI_4$, $ZrI_4$, $HfI_4$, $SnI_2$, $SnI_4$, $GeI_2$, $GeI_4$, CuBr, AgBr, AuBr, $ZnBr_2$, $NiBr_2$, $PdBr_2$, $PtBr_2$, $CoBr_2$, $RhBr_2$, $IrBr_2$, $FeBr_2$, $RuBr_2$, $IrBr_2$, $FeBr_2$, $RuBr_2$, $OsBr_2$, $MnBr_2$, $TcBr_2$, $ReBr_2$, $CrBr_3$, $MoBr_3$, $WBr_3$, $VBr_3$, $NbBr_3$, $TaBr_3$, $TiBr_4$, $ZrBr_4$, $HfBr_4$, CuCl, AgCl, AuCl, $ZnCl_2$, $NiCl_2$, $PdCl_2$, $PtCl_2$, $CoCl_2$, $RhCl_2$, $IrCl_2$, $FeCl_2$, $RuCl_2$, $IrCl_2$, $FeCl_2$, $RuCl_2$, $OsCl_2$, $MnCl_2$, $TcCl_2$, $ReCl_2$, $CrCl_3$, $MoCl_3$, $WCl_3$, $VCl_3$, $NbCl_3$, $TaCl_3$, $TiCl_4$, $ZrCl_4$, and $HfCl_4$.

The p-type charge generating layer 520 may include the transition metal halide, and the transition metal halide may be doped to the organic material. For example, the organic material may include a quinoline derivative, and, for example, it may include at least one compound selected from among tris(8-hydroxyquinolinato)aluminum (Alq3), 3-(4-biphenyl)-4-phenyl-5-(4-tert-butylphenyl)-1,2,4-triazole (TAZ), (2-methyl-8-quninolinato)-4-phenylphenolate (Balq), bis(10-hydroxybenzo(h)quinolinato)beryllium (Bebq2), and 4,7-diphenyl-1-10-phenanthroline (BPhen).

When the p-type charge generating layer 520 does not include an organic material and is made of a transition metal halide, the holes may be generated more easily, and the holes may be more smoothly supplied into the light-emitting diode.

In an example embodiment, the p-type charge generating layer 520 includes an iodide from among the transition metal halides. Because iodine atoms are large, a bonding force of the transition metal and the iodine may be weak, and the transition metal may be more easily separated from the iodine to generate holes effectively.

According to an example embodiment, the p-type charge generating layer 520 may include the inorganic material such as the transition metal halide, in which case the light-emitting diode may have a lower possibility of thermal decomposition than the p-type charge generating layer 520 including an oxide. In addition, the p-type charge generating layer 520 including such an oxide may have a high thermal evaporation temperature, whereas in the present example embodiment, the p-type charge generating layer 520 may be formed at a relatively lower temperature.

In the present example embodiment, the first electrode 1000 may be a cathode, and the second electrode 2000 may be an anode. The first electrode 1000 represents an electrode for injecting electrons into an emission layer when receiving a current, and it may include a material with a low work function. The second electrode 2000, an anode, represents an electrode for injecting holes to the emission layer when receiving a current, and it may include a material with a high work function. However, without being limited to this, the first electrode 1000 may be the anode and the second electrode 2000 may be the cathode depending on the example embodiment.

The first electrode 1000 and the second electrode 2000 may include, for example, a conductive oxide such as indium tin oxide (ITO), indium zinc oxide (IZO), zinc tin oxide (ZTO), copper indium oxide (CIO), copper zinc oxide (CZO), gallium zinc oxide (GZO), aluminum zinc oxide (AZO), tin oxide (SnO2), zinc oxide (ZnO), or a combination thereof, and/or, for example, calcium (Ca), ytterbium (Yb), aluminum (Al), silver (Ag), magnesium (Mg), samarium (Sm), titanium (Ti), gold (Au), or an alloy thereof, and/or, for example, a conductive polymer such as graphene, carbon nanotubes, or PEDOT:PSS. However, the first electrode 1000 and the second electrode 2000 are not limited thereto. The first electrode 1000 and the second electrode 2000 may be formed with, for example a single or multi-layered stacked structure.

The first light-emission unit 400 will now be described.

The first light-emission unit includes the first electron transfer layer 420 and the first hole transfer layer 430 overlapping with the first emission layer 410 therebetween. The first emission layer 410 may include, for example, an emission layer host and an emission dopant. In this instance, the content of the dopant is variable by an emission layer forming material, and in general, it may be 3 to 10 parts by weight with reference to 100 parts by weight of the emission layer forming material (the total weight of the host and the dopant).

A material of the emission layer host may include, for example, tris(8-hydroxy-quinolinato)aluminum (Alq3), 9,10-di(napth-2-yl)anthracene (AND), 3-tert-butyl-9,10-di (naphth-2-yl)anthracene (TBADN), 4,4'-bis(2,2-diphenyl-ethene-1-yl)-4,4'-dimethylphenyl (DPVBi), 4,4'-bisbis(2,2-diphenyl-ethene-1-yl)-4,4'-methylphenyl (p-DMDPVBi), tert(9,9-diarylfluorene)s (TDAF), 2-(9,9'-spirobifluorene-2-yl)-9,9'-spirobifluorene (BSDF), 2,7-bis(9,9'-spirobifluorene-2-yl)-9,9'-spirobifluorene (TSDF), bis(9,9-diarylfluorene)s (BDAF), 4,4'-bis(2,2-diphenyl-ethene-1-yl)-4,4'-di-(tert-butyl)phenyl (p-TDPVBi), or the like, and a phosphorescent host may have a material including, for example, 1,3-bis(carbazole-9-yl)benzene (mCP), 1,3,5-tris (carbazole-9-yl)benzene (tCP), 4,4',4''-tris(carbazole-9-yl) triphenylamine (TcTa), 4,4'-bis(carbazole-9-yl)biphenyl (C-BP), 4,4'-bis(9-carbazolyl)-2,2'-dimethyl-biphenyl (CBDP), 4,4'-bis(carbazole-9-yl)-9,9-dimethyl-fluorene (DMFL-C-BP), 4,4'-bis(carbazole-9-yl)-9,9-bis(9-phenyl-9H-carbazole)fluorene (FL-4CBP), 4,4'-bis(carbazole-9-yl)-9,9-di-tolyl-fluorene (DPFL-CBP), 9,9-bis(9-phenyl-9H-carbazole)fluorene (FL-2CBP), or the like.

The dopant may include, for example, an 8-hydroxyquinoline, a quasi-derivative complex, and a benzazole derivative, and it is not limited thereto. In another example embodiment, the first emission layer 410 may include a quantum dot.

The first electron transfer layer 420 may include, for example, a quinoline derivative, for example, it may include at least one compound selected from among tris(8-hydroxy-quinolinato)aluminum (Alq3), 3-(4-biphenyl)-4-phenyl-5-(4-tert-butylphenyl)-1,2,4-triazole (TAZ), (2-methyl-8-quinolinato)-4-phenylphenolate (Balq), bis(10-hydroxybenzo (h)quinolinato)beryllium (Bebq2), and 4,7-diphenyl-1-10-phenanthroline (BPhen). In another example embodiment, Liq may be doped to the compound selected from among a plurality of the compounds. In this instance, a doping concentration may be up to, for example, about 50 wt %.

The first hole transfer layer 430 may include, for example, a carbazole derivative such as N-phenylcarbazole or polyvinylcarbazole, and/or an amine derivative with an aromatic condensed ring such as N,N'-bis(3-methylphenyl)-N,N'-diphenyl-[1,1-biphenyl]-4,4'-diamine (TPD) or N,N-di(naphthalene-1-yl)-N,N'-diphenyl benzidine (α-NPD).

The second light-emission unit 600 will now be described.

The second light-emission unit 600 includes the second electron transfer layer 620 and the second hole transfer layer 630 overlapping each other with the second emission layer 610 therebetween. The description on the second light-emission unit 600 corresponds to the description on the first light-emission unit 400. A detailed description on the same constituent elements will be omitted. However, the first emission layer 410 of the first light-emission unit 400 and the second emission layer 610 of the second light-emission unit 600 may emit different colors or a same color.

The light emission efficiency of the light-emitting diode may be improved by forming the light-emitting diode with a plurality of stacked structures. A region for recombining holes and electrons may include a plurality of layers in the light-emitting diode in a layer-stacked structure, which may help improve the light emitting region compared to the single-layered structure.

Further, when the light-emitting diode is formed with a plurality of stacked structures, the lifespan of the light-emitting diode may be increased. When the light-emitting diode in a layer-stacked structure emits white light with the same luminance as the single-layered structure, the luminance of the white light emitted by the respective layers in the stacked structure may be reduced by the number of stacked layers, thereby increasing the lifespan in proportion to the number of layers.

According to an example embodiment, a configuration includes two light-emission units. A light-emitting diode according to another example embodiment may include at least three light-emission units. In this case, a charge generating layer may be respectively provided between adjacent light-emission units.

Figure 2:
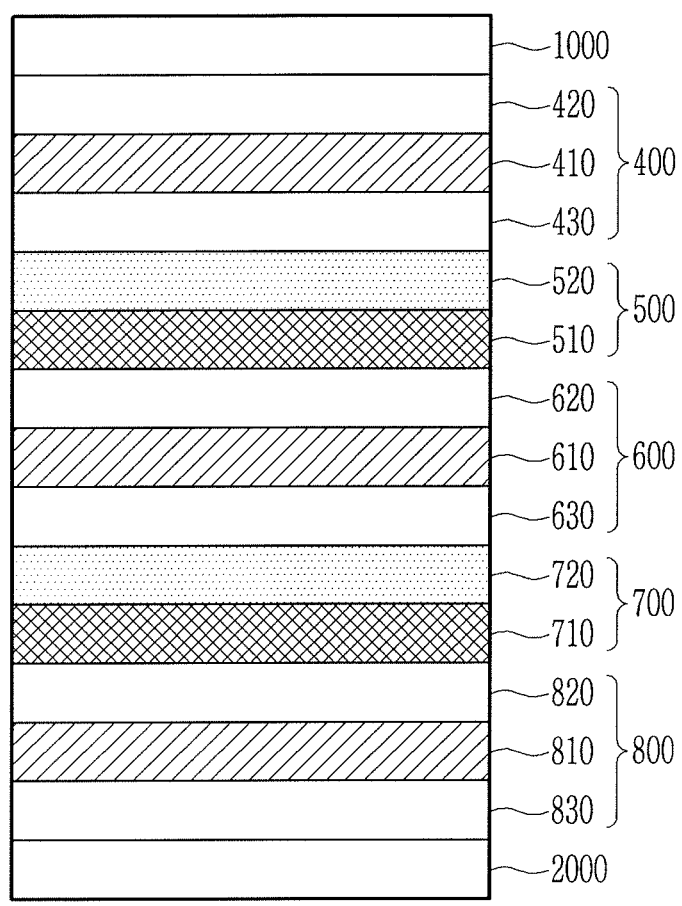
FIG. 2 illustrates a cross-sectional view of a light-emitting diode according to another example embodiment.

FIG. 2 shows a cross-sectional view of a light-emitting diode according to another example embodiment.

Referring to FIG. 2, the light-emitting diode according to the present example embodiment further includes a third light-emission unit 800 including a third emission layer 810, a third electron transfer layer 820, and a third hole transfer layer 830 in comparison to the light-emitting diode described with reference to FIG. 1.

Further, the first charge generating layer 500 is provided between the first light-emission unit 400 and the second light-emission unit 600, and a second charge generating layer 700 is provided between the second light-emission unit 600 and the third light-emission unit 800. The first charge generating layer 500 includes the n-type charge generating layer 510 and the p-type charge generating layer 520, and the second charge generating layer 700 also includes an n-type charge generating layer 710 and a p-type charge generating layer 720.

The first light-emission unit 400, the second light-emission unit 600, and the third light-emission unit 800 may be described in a like manner of the above description. That is, a detailed description on the first light-emission unit 400 according to an example embodiment of FIG. 1 is applicable to the second light-emission unit 600 and the third light-emission unit 800, and a detailed description on the same constituent elements will not be repeated.

In addition, the first charge generating layer 500 and the second charge generating layer 700 will be described in a like manner of the description on the charge generating layer 500 of FIG. 1. The n-type charge generating layer of each charge generating layer may include an organic material and an inorganic material doped to the organic material, and the inorganic material may include an alkali halide doped to the lanthanide metal or the alkali earth metal. Further, the p-type charge generating layer of each charge generating layer may include a transition metal halide. A detailed description of the same constituent elements will not be repeated.

The light-emitting diode according to the present example embodiment includes at least three light-emission units, and the respective light-emission units may emit the same color or different colors. When the light-emission units express different colors, respectively, one light-emission unit may emit yellow and the other two light-emission units may emit blue. In another way, the light-emission units may emit green, red, and blue, respectively.

A light-emitting diode according to an example embodiment includes a plurality of light-emission units, and a charge generating layer including an n-type charge generating layer and a p-type charge generating layer is provided between the respective light-emission units. The n-type charge generating layer includes an organic material and an inorganic material doped to the organic material, and the inorganic material includes an alkali halide doped to the lanthanide metal or the alkali earth metal. Further, the p-type charge generating layer includes a transition metal halide. The charge generating layer may increase the emission efficiency of the light-emitting diode.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Experimental Example 1: n-Type Charge Generating Layer

Regarding a light-emitting diode including a plurality of light-emission units, the p-type charge generating layer uses NDP-9 and the n-type charge generating layer uses a different material to measure color coordinates, a driving voltage, and efficiency, which is expressed in Table 1. The efficiency in this instance shows light efficiency, that is, luminance.

TABLE 1

| p-doping = NDP-9 | | L (Reference luminance) | CIE_x | CIE_y | Driving voltage (V) | Efficiency (cd/A) |
| --- | --- | --- | --- | --- | --- | --- |
| Comparative Example 1 | Mg (2 vol %) | 6500 nit | 0.288 | 0.286 | 21.2 | 50 |
| Comparative Example 2 | Yb (2 vol %) | 6500 nit | 0.288 | 0.286 | 17.5 | 66 |
| Comparative Example 3 | CsI (2 vol %) | 6500 nit | 0.291 | 0.312 | 15.5 | 71 |
| Example 1 | Mg + CsI (2 vol %) | 6500 nit | 0.286 | 0.293 | 10.5 | 80 |
| Example 2 | Yb + CsI (2 vol %) | 6500 nit | 0.285 | 0.294 | 10.2 | 84 |

Table 1 uses various materials by doping the same to the organic material at 2 volume %. Referring to Table 1, it was found that the effects of Example 1 using the alkali earth metal and the alkali halide simultaneously and Example 2 using the lanthanide metal and the alkali halide simultaneously were better than the light-emitting diode including a single alkali earth metal (Comparative Example 1) or a lanthanide metal (Comparative Example 2) or the light-emitting diode including an alkali halide (Comparative Example 3).

That is, it was determined that Examples 1 and 2 had a lower driving voltage than Comparative Examples 1 to 3 and increased efficiency. Without being bound by theory, it is believed that these effects are because the n-type charge generating layer simultaneously includes the alkali earth metal or the lanthanide metal, and the alkali halide, so generation of electrons in the n-type charge generating layer becomes active.

Experimental Example 2: n-Type Charge Generating Layer+p-Type Charge Generating Layer This has a same conditions as Experimental Example 1, but CuI rather than NDP-9 is applied as the p-type charge generating layer to measure color coordinate, a driving voltage, and efficiency, and its result is expressed in Table 2.

TABLE 2

| | p-doping = CuI | L (Reference luminance) | CIE_x | CIE_y | Driving voltage (V) | Efficiency (cd/A) |
|---|---|---|---|---|---|---|
| Comparative Example 4 | Mg (2 vol %) | 6500 nit | 0.286 | 0.284 | 18.5 | 55 |
| Comparative Example 5 | Yb (2 vol %) | 6500 nit | 0.288 | 0.286 | 15.2 | 70 |
| Comparative Example 6 | CsI (2 vol %) | 6500 nit | 0.290 | 0.313 | 13.1 | 77 |
| Example 3 | Mg + CsI (2 vol %) | 6500 nit | 0.288 | 0.286 | 9.0 | 90 |
| Example 4 | Yb + CsI (2 vol %) | 6500 nit | 0.286 | 0.294 | 8.5 | 92 |

Referring to Table 2, Example 3 using an alkali earth metal and an alkali halide simultaneously and Example 4 using a lanthanide metal and an alkali halide simultaneously have better effects than the light-emitting diode including a single alkali earth metal (Comparative Example 4) or a lanthanide metal (Comparative Example 5), or the light-emitting diode including an alkali halide (Comparative Example 6).

Further, when Table 1 and Table 2 are compared, it was determined that Examples 3 and 4 applying CuI for the p-type charge generating layer had better effects than Examples 1 and 2 applying NDP-9 for the p-type charge generating layer. That is, when CuI, an alkali halide, was applied for the p-type charge generating layer, and the alkali halide doped to the lanthanide metal or the alkali earth metal was included for the n-type charge generating layer, it was determined that the driving voltage was reduced and the efficiency increased.

Without being bound by theory, it is believed that these effects are because the n-type charge generating layer simultaneously includes the alkali earth metal or the lanthanide metal, and the alkali halide, so generation of electrons in the n-type charge generating layer becomes active and the p-type charge generating layer includes a transition metal halide to boost generation of holes.

A display device according to an example embodiment will now be described.

Figure 3:
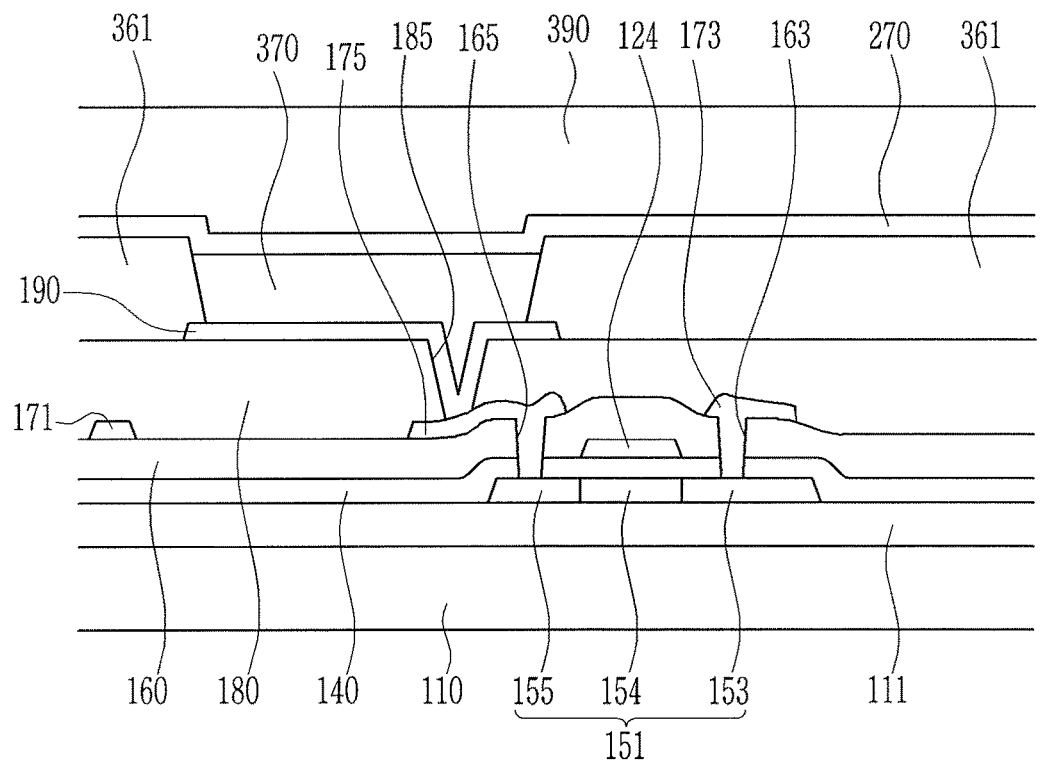
FIG. 3 illustrates a cross-sectional view of a display device according to an example embodiment.

FIG. 3 shows a cross-sectional view of a display device according to an example embodiment.

Referring to FIG. 3, in the present example embodiment a blocking layer 111 made of, for example, a silicon oxide or a silicon nitride is provided on a substrate 110.

A semiconductor layer 151 is provided on the blocking layer 111. The semiconductor layer 151 includes a source region 153 and a drain region 155, for example, doped with a p-type impurity, and includes a channel region 154 provided between the source region 153 and the drain region 155.

A gate insulating layer 140 may be provided on the semiconductor layer 151 and the blocking layer 111, and may include, for example a silicon oxide or a silicon nitride. A control electrode 124 overlaps the channel region 154 of the semiconductor layer 151 and is provided on the gate insulating layer 140.

An interlayer insulating layer 160 is provided on the control electrode 124 and the gate insulating layer 140. The interlayer insulating layer 160 includes a first contact hole 165 and a second contact hole 163.

A data conductor including a data line 171, an input electrode 173, and an output electrode 175 is provided on the interlayer insulating layer 160.

The output electrode 175 is connected to the drain region 155 through the first contact hole 165. The input electrode 173 is connected to the source region 153 through the second contact hole 163.

A passivation layer 180 is provided on the data conductors 171, 173, and 175 and the interlayer insulating layer 160, and the passivation layer 180 includes a contact hole 185.

A pixel electrode 190 is provided on the passivation layer 180. The pixel electrode 190 is connected to the output electrode 175 through the contact hole 185. A partition wall 361 is provided on the passivation layer 180. A light-emitting diode layer 370 is provided to overlap the pixel electrode 190, and a common electrode 270 is provided to overlap the light-emitting diode layer 370. The light-emitting diode includes the pixel electrode 190, the light-emitting diode layer 370, and the common electrode 270.

In this instance, the pixel electrode 190 may be an anode that is a hole injection electrode and may correspond to the second electrode 2000 described with reference to FIG. 1, and the common electrode 270 may be a cathode that is an electron injection electrode and may correspond to the first electrode 1000 described with reference to FIG. 1. However, without being limited to this, the pixel electrode 190 may be a cathode and the common electrode 270 may be an anode depending on a method for driving a display device.

The light-emitting diode layer 370 may include a first light-emission unit 400, a second light-emission unit 600, and a first charge generating layer 500 provided between the first light-emission unit 400 and the second light-emission unit 600 described with reference to FIG. 1, which will not be described again. Further, the light-emitting diode layer 370 may include a first light-emission unit 400, a second light-emission unit 600, a third light-emission unit 800, a first charge generating layer 500 provided between the first light-emission unit 400 and the second light-emission unit 600, and a second charge generating layer 700 provided between the second light-emission unit 600 and the third light-emission unit 800 described with reference to FIG. 2, which will not be described again.

An encapsulation layer 390 is provided to overlap the common electrode 270. The encapsulation layer 390 may include, for example, an organic material or an inorganic material, or it may be formed with alternately stacked organic and inorganic materials. The encapsulation layer 390 may protect the display device from moisture, heat, and contaminants.

By way of summation and review, improvement of injection of holes and electrons may improve efficiency of the organic light emitting element.

As described above, embodiments may provide a light-emitting diode exhibiting improved light-emission efficiency, and a display device including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A light-emitting diode, comprising:
    a first electrode;
    a second electrode overlapping the first electrode;
    a first emission layer and a second emission layer provided between the first electrode and the second electrode; and
    a first charge generating layer provided between the first emission layer and the second emission layer, the first charge generating layer including a p-type charge generating layer and an n-type charge generating layer,
    wherein:
    the n-type charge generating layer includes an organic material and an inorganic material doped to the organic material,
    the inorganic material includes a lanthanide metal, an alkali halide, and a ternary compound generated by combining the lanthanide metal and the alkali halide, or
    the inorganic material includes an alkali earth metal, the alkali halide, and a ternary compound generated by combining the alkali earth metal and the alkali halide.

2. The light-emitting diode as claimed in claim 1, wherein the p-type charge generating layer includes a transition metal halide.

3. The light-emitting diode as claimed in claim 2, wherein the p-type charge generating layer includes at least one selected from among $CuI$, $AgI$, $AuI$, $ZnI_2$, $NiI_2$, $PdI_2$, $PtI_2$, $CoI_2$, $RhI_2$, $IrI_2$, $FeI_2$, $RuI_2$, $IrI_2$, $FeI_2$, $RuI_2$, $OsI_2$, $MnI_2$, $TcI_2$, $ReI_2$, $CrI_3$, $MoI_3$, $WI_3$, $VI_3$, $NbI_3$, $TaI_3$, $TiI_4$, $ZrI_4$, $HfI_4$, $SnI_2$, $SnI_4$, $GeI_2$, $GeI_4$, $CuBr$, $AgBr$, $AuBr$, $ZnBr_2$, $NiBr_2$, $PdBr_2$, $PtBr_2$, $CoBr_2$, $RhBr_2$, $IrBr_2$, $FeBr_2$, $RuBr_2$, $IrBr_2$, $FeBr_2$, $RuBr_2$, $OsBr_2$, $MnBr_2$, $TcBr_2$, $ReBr_2$, $CrBr_3$, $MoBr_3$, $WBr_3$, $VBr_3$, $NbBr_3$, $TaBr_3$, $TiBr_4$, $ZrBr_4$, $HfBr_4$, $CuCl$, $AgCl$, $AuCl$, $ZnCl_2$, $NiCl_2$, $PdCl_2$, $PtCl_2$, $CoCl_2$, $RhCl_2$, $IrCl_2$, $FeCl_2$, $RuCl_2$, $IrCl_2$, $FeCl_2$, $RuCl_2$, $OSCl_2$, $MnCl_2$, $TcCl_2$, $ReCl_2$, $CrCl_3$, $MoCl_3$, $WCl_3$, $VCl_3$, $NbCl_3$, $TaCl_3$, $TiCl_4$, $ZrCl_4$, and $HfCl_4$.

4. The light-emitting diode as claimed in claim 2, wherein the p-type charge generating layer does not include an organic material.

5. The light-emitting diode as claimed in claim 2, wherein the p-type charge generating layer includes a transition metal halide doped to an organic material.

6. The light-emitting diode as claimed in claim 1, wherein a content of an inorganic material doped on the n-type charge generating layer is about 1 volume % to about 25 volume %.

7. The light-emitting diode as claimed in claim 6, wherein a volume ratio of the lanthanide metal or the alkali earth metal from among the inorganic material vs. the alkali halide is about 1:1.

8. The light-emitting diode as claimed in claim 1, wherein the inorganic material includes:
    at least one metal selected from among La, Ce, Pr, Nd, Pm, Sm, Eu, Gd, Tb, Dy, Ho, Er, Tm, Yb, Lu, Mg, Ca, Sr, Ba, and Ra, at least one alkali halide selected from among LiCl, NaCl, KCl, RbCl, CsCl, FrCl, LiBr, NaBr, KBr, RbBr, CsBr, FrBr, LiI, NaI, KI, RbI, CsI, and FrI, and a ternary compound generated by combining one selected from among the metals and one selected from among the alkali halides.

9. The light-emitting diode as claimed in claim 8, wherein the inorganic material includes at least one selected from Yb, Eu, Sm, Tm, Mg, Ca, Sr, KI, RbI, CsI, $YbKI_3$, $YbRbI_3$, and $YbCsI_3$.

10. The light-emitting diode as claimed in claim 1, wherein the light-emitting diode further includes:
    a third emission layer provided between the first electrode and the second electrode; and
    a second charge generating layer provided between the second emission layer and the third emission layer, the second charge generating layer including a second p-type charge generating layer and a second n-type charge generating layer,
    wherein:
    the second n-type charge generating layer includes an organic material and an inorganic material doped to the organic material, and
    the inorganic material includes an alkali halide doped to the lanthanide metal or the alkali earth metal.

11. The light-emitting diode as claimed in claim 10, wherein the second p-type charge generating layer includes a transition metal halide.

12. A display device, comprising:
    a substrate;
    a transistor provided on the substrate; and
    a light-emitting diode connected to the transistor, the light-emitting diode including:
    a first electrode,
    a second electrode overlapping the first electrode,
    a first emission layer and a second emission layer provided between the first electrode and the second electrode, and
    a first charge generating layer provided between the first emission layer and the second emission layer, the first charge generating layer including a p-type charge generating layer and an n-type charge generating layer,
    wherein:
    the n-type charge generating layer includes an organic material and an inorganic material doped to the organic material,
    the inorganic material includes a lanthanide metal, an alkali halide, and a ternary compound generated by combining the lanthanide metal and the alkali halide, or
    the inorganic material includes an alkali earth metal, the alkali halide, and a ternary compound generated by combining the alkali earth metal and the alkali halide.

13. The display device as claimed in claim 12, wherein the p-type charge generating layer includes a transition metal halide.

14. The display device as claimed in claim 12, wherein the p-type charge generating layer does not include an organic material.

15. The display device as claimed in claim 12, wherein the p-type charge generating layer includes a transition metal halide doped to the organic material.

16. The display device as claimed in claim 12, wherein a content of an inorganic material doped from among the n-type charge generating layer is about 1 volume % to about 25 volume %.

17. The display device as claimed in claim 16, wherein a volume ratio of the lanthanide metal or the alkali earth metal from among the inorganic material vs. the alkali halide is about 1:1.

18. The display device as claimed in claim 12, wherein the display device further includes:
   a third emission layer provided between the first electrode and the second electrode; and
   a second charge generating layer provided between the second emission layer and the third emission layer, the second charge generating layer including a second p-type charge generating layer and a second n-type charge generating layer,
   wherein:
   the second n-type charge generating layer includes an organic material and an inorganic material doped to the organic material, and
   the inorganic material includes an alkali halide doped to the lanthanide metal or the alkali earth metal.

* * * * *